United States Patent [19]

Hammond

[11] Patent Number: 4,487,300

[45] Date of Patent: Dec. 11, 1984

[54] VIBRATION ADJUSTABLE SPACER

[75] Inventor: Robert J. Hammond, Stevensville, Mich.

[73] Assignee: The Bendix Corporation, Southfield, Mich.

[21] Appl. No.: 447,335

[22] Filed: Dec. 6, 1982

Related U.S. Application Data

[62] Division of Ser. No. 227,028, Jan. 21, 1981, Pat. No. 4,386,390.

[51] Int. Cl.³ .......................... F16F 7/10; H05K 1/14
[52] U.S. Cl. .................................. 188/378; 361/412; 361/415
[58] Field of Search ............... 188/67, 265, 378, 379, 188/380, 381, 382, 270, 300; 267/134, 136, 140.1; 174/42; 361/412, 415; 74/1 SS, 575, 577, 578; 248/566

[56] References Cited

U.S. PATENT DOCUMENTS

| | | | |
|---|---|---|---|
| 1,352,172 | 9/1920 | Brandon | 188/67 |
| 2,195,041 | 3/1940 | von Schlippe | 174/42 |
| 3,085,657 | 4/1963 | Preis | 188/380 |
| 4,054,190 | 10/1977 | Wilkes | 188/381 |
| 4,386,390 | 5/1983 | Hammond | 361/412 |

FOREIGN PATENT DOCUMENTS

| | | | |
|---|---|---|---|
| 2904604 | 8/1980 | Fed. Rep. of Germany | 361/415 |
| 52877 | 8/1945 | France | 188/67 |
| 902367 | 8/1945 | France | 188/67 |
| 372757 | 5/1973 | U.S.S.R. | 188/379 |

Primary Examiner—Bruce H. Stoner, Jr.
Assistant Examiner—R. R. Diefendorf
Attorney, Agent, or Firm—Larry J. Palguta; Ken C. Decker

[57] ABSTRACT

A vibration adjustable spacer (10) is disclosed. In a preferred implementation spacers 10, 10', 10" are used to damp the vibrational resonance of a number of printed circuit boards (42, 44, 46) in an assembly (40). The spacer (10) has an adjustable snubbing member (30) which extends to abut an essentially stationary surface (7) when the board is accelerated in one direction and a pivotable member (22) operating such that retraction of the snubbing member is impeded when the board is accelerated in the opposite direction.

4 Claims, 12 Drawing Figures

VIBRATION ADJUSTABLE SPACER

This is a division of application Ser. No. 227,028, filed Jan. 21, 1981, now U.S. Pat. No. 4,386,390, issued May 31, 1983.

The invention pertains generally to a vibration adjustable spacer and is more particularly directed to such spacers when used as motion dampers for printed circuit boards.

Many mechanisms today are subjected to a vibrational environment where system failure often occurs due to excessive motion of some particular part at resonance. This resonance is due to the dynamic or repetitive loading of the part during vibrations of many frequencies which produce a standing wave oscillation at its natural frequency or some harmonic thereof. The flexion of the part continues until the fatique strength of the particular element is exceeded and failure of the entire mechanism follows. Therefore, methods to prevent the excessive motion of critical elements due to vibration are of primary importance in designing these mechanisms. Additionally, methods to prevent natural frequency modes of oscillation are a necessity.

One field in which the behavior of an element at resonance during vibration must be controlled is electronic packaging. This is because electronic controllers are becoming more prevalent in all types of mechanisms, such as aircraft and automobiles, that must operate in vibrational environments. Typically, the electronic components of a controller are conventionally mounted on a plurality of printed circuit boards which are enclosed in a housing. The printed circuit boards are generally rectangular in shape and are supported at their edges by the notches of guide members or other mounting techniques. The medial sections of the printed circuit boards are, thus, free to flex due to vibrational inputs to the housing. This flexion of the circuit boards will cause circuit element failure if enough cycles are collected during a resonate condition.

The larger the amplitude of the deflection and the higher the frequency of the deflection, the sooner a fatigue failure will take place. As a general rule, typical electronic components conventionally mounted on a printed circuit board can withstand almost indefinitely board deflections on the order of three/thousandths inch per inch of board span. Therefore, the prior art has been directed to an effort to limit board deflection to these values with certain attendant disadvantages.

One method of reducing the flexion of printed circuit boards has been to increase the board stiffness. Closely spaced board supports are often used to increase board stiffness, but this technique impedes large board removal and in multiboard stacks imposes serious requirements on the supporting members. Moreover, board ribs or stiffening members limit component capacity on the circuit board and require isolation from the exposed circuitry.

One of the more appealing methods of printed circuit board resonance protection has been the use of snubbers that provide excessive flexion protection by means of an energy transfer to an adjacent surface or board by contact. The touch of the snubber during flexion to an adjacent surface transfers enough energy to damp any standing wave oscillation. There are, however, two major disadvantages to the use of these snubbers because of their fixed height. The first is that as smaller boards are used the allowable deflection and spacing between boards is decreased accordingly. The closer height tolerances that consequently result become prohibitive to maintain as do the mounting tolerances. Another disadvantage of the present board snubbers is that any warpage in an adjacent board may allow additional movement that is not protected by a fixed clearance snubber.

SUMMARY OF THE INVENTION

The invention provides a vibration adjustable spacer which is preferably used as a vibration damper in the mounting of printed circuit boards.

A first embodiment of the adjustable spacer comprises a supporting member, preferably fixed to a printed circuit board, which mounts a pin orthagonally to the printed circuit board plane. The pin is thus directed in the direction of a vibratory movement of the board. Mounted slidably on the pin is an extensible snubbing means which is extended by accelerations of the printed circuit board in the direction opposite an adjacent surface. Further included is a means for locking the snubbing means in the extended position against the adjacent surface upon opposite accelerations during vibratory motion of the board. The locking means thereby provides a ratcheting effect where motions in one direction are unopposed while motions in the other direction are impeded.

In a preferred form the locking means includes a member pivoted on a fulcrum of an upraised arm of the supporting member. The pivotable member rotates to permit the extensible means to move on the pin when the vibratory motion is in the direction of an adjacent surface. Once the extensible means has moved on the pin and touched the adjacent surface and the board begins to decelerate, then the locking means pivots to its original position and retains the extensible means in a snubbing position. Further oscillations of the board are damped by the extensible means touching the adjacent surface and transferring energy from the resonant mode to the adjacent board or the housing.

In a second embodiment the spacer comprises a generally cylindrical housing mounting on a printed circuit board and having a central bore. The housing reciprocally guides a piston having a snubbing surface on its head. The piston extends in the bore under the influence of accelerations in the opposite direction of an adjacent board until it contacts the surface thereof. At that point, further oscillations of the board are damped by the snubbing surface contacting the adjacent surface and transferring resonant energy.

The second embodiment further includes a pivotable member acting as a ratchet. In this implementation the pivotable member takes the form of a washer positioned generally concentric with the bore. The washer pivots on a radial tang to produce a locking action for motions in one direction and to produce unopposed extension of the piston for motions in the other direction.

The present invention has the advantages of being light weight, using small areas of board space, and having a low cost. Importantly, it further allows the spacing of adjacent boards to vary over a wide range as may the board mounting tolerances in any of the guide members.

Still further, the invention provides another advantage in allowing the boards in a multiboard stack to be removed easily without any disassembly or removal of the spacer from the board. A simple movement in the correct direction will permit all the spacers in a multi-board stack to be retracted, simultaneously.

Another advantage of the invention is that because the extensible means actually adjusts itself to touch the adjacent boards, higher modes of vibration may be damped out without the necessity of using close tolerances.

These and other objects, features, and advantages of the invention will be more fully described and better understood if a reading of the following detailed description is undertaken in conjunction with the attached drawings wherein:

BRIEF DESCRIPTION OF THE DRAWINGS

FIG. 11 is a cross-sectional top view of the vibration adjustable spacer illustrated in FIG. 9; and FIG. 12 is a cross-section top view of the vibration adjustable spacer illustrated in FIG. 10.

DETAILED DESCRIPTION OF THE PREFERRED EMBODIMENTS

Figure 1:
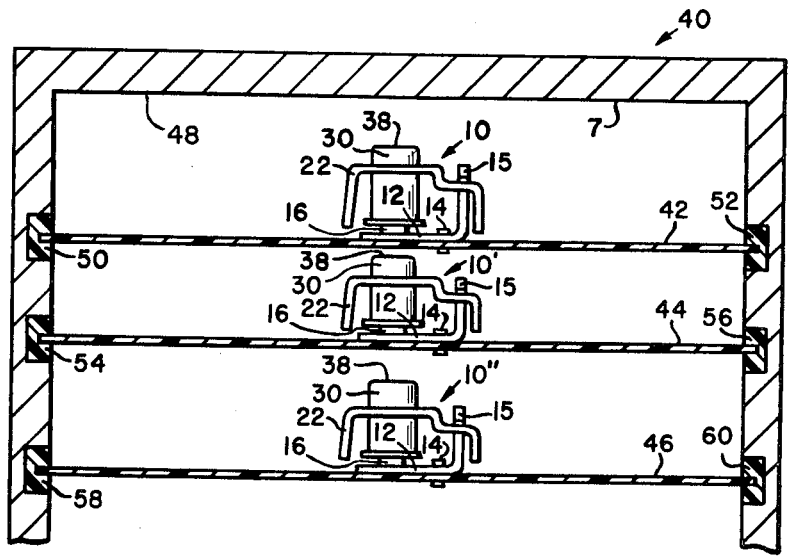
FIG. 1 is a fragmentary side view of a multiboard stack of printed circuit boards in a housing, wherein each board mounts a vibration adjustable spacer constructed in accordance with the invention.

One preferred embodiment of the invention for advantageous use with printed circuit boards is illustrated with respect to FIG. 1. A printed circuit board assembly 40 comprises a plurality of printed circuit boards 42, 44, 46, each having a generally rectangular shape and being supported along at least two edges by notches of guide members 50, 52, 54, 56, 58, 60. The guide members slide into slots in a housing or cabinet 48 as shown in the first figure. Between each printed circuit board is a vibration adjustable spacer 10, 10', 10'', for damping vibratory or resonant motions of the boards when the housing 48 is subjected to environmental perturbations. As many printed circuit boards as desired can be formed into a multiboard stack as this but only three have been shown for exemplary purposes.

Conventional connections and mounting techniques for the boards 42, 44, 46, are used where one of the non-supported edges of the boards plugs into an electrical connector which supplies power and signal leads for the circuit components contained thereon. The other free edge of the board is used for removal and may include gripping means for facilitating its replacement.

It is to be noted that the spacing between different boards is nonequivalent. This is because different sizes of components and components with unequal cooling requirements may be mounted on each board. Normally, this would require different lengths for board snubbers and closely matched tolerances for the guide means. However, with the adjustable spacers 10, all the vibration dampers for one assembly can be identical and tolerances on locating the guide members reduced considerably. Each spacer will adjust itself to the differing spacings to make up for mounting tolerance error and circuit element size as will be more fully explained, hereinafter.

The spacers 10 may be placed either individually or in multiple positions on each board. In the drawing the placement is shown as the center of the boards or at the maximum deflection point. This is because the maximum distance away from the edge supports will be the most advantageous place for energy transfer from a resonant condition. However, it is evident that the spacers can be positioned at any placement on the boards.

Figure 8:
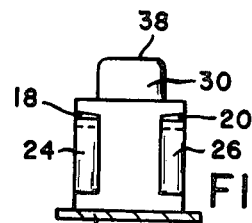
FIG. 8 is a rear view of the vibration adjustable spacer illustrated in FIG. 4.

Each of the spacers 10, as is better illustrated in FIGS. 4-8, includes a generally L-shaped base member 12 which is fixed or pinned to the printed circuit board 42 by a rivet 14. The base member 12 comprises a generally horizontal support platform that mounts a generally vertically upstanding pin 16. The base member 12 further includes a vertical arm 15 which provides a pair of fulcrum points for a pivotable member 22 by means of two notches 18 and 20 (FIG. 8). The notches 18 and 20 receive downwardly bent fingers 24, 26 which are formed on the bifurcated end of the generally channel-shaped pivotable member 22. The pivotable member rotates angularly, clockwise and counterclockwise as shown by the arrows, on the fulcrum points.

The pivotable member 22 is balanced on the side opposite the fingers by a generally flat ballast tab 23. When at rest (position shown in FIG. 4) the pivotable member is fully rotated counterclockwise as the weight of the ballast tab 23 pulls the member down into this position. When the pivotable member is pivoted upward, its clockwise rotation is limited by the ends of the fingers 24 and 26 (position shown in FIG. 6).

Slidably mounted on the pin 16 is a generally annular snubbing means 30 with an inner bore, closed at one end, which allows reciprocal motion between the pin and the snubbing means. The snubbing means 30 further has a radial flange 34 on the other end for limiting movement of the means on pin 16. The snubbing means is extensible on the pin through an aperture 36 in the pivotable member and may extend to where the flange abuts the pivotable member. The snubbing means is limited in its retraction at the position where the pin 16 meets the closed end of the inner bore.

Figure 5:
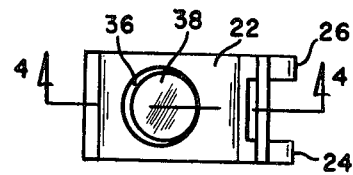
FIG. 5 is a top view of the unextended vibration adjustable spacer illustrated in FIG. 4.
Figure 6:
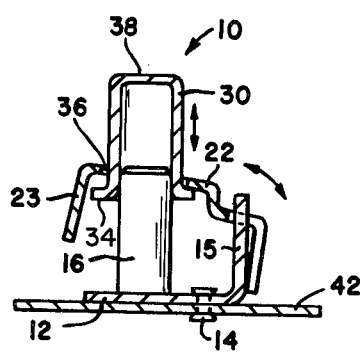
FIG. 6 is a cross-sectional side view of the vibration adjustable spacer illustrated in FIG. 4, extended.
Figure 7:
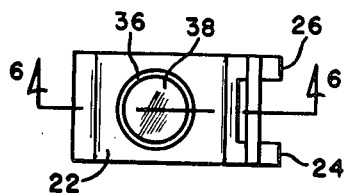
FIG. 7 is a top view of the extended vibration adjustable spacer illustrated in FIG. 6.

When the pivotable member 22 is fully rotated in the counterclockwise direction as is best seen in FIG. 5, the edge of aperture 36 has a point of tangency with the outside surface of the snubbing means. This locks or restricts the snubbing means against the edge of the aperture in such a manner that it forms a frictional fit and resists the downward movement of the snubbing means from an extended position. However, when the pivotable member 22 is rotated fully clockwise, as is best seen in FIG. 6, the point of tangency is no longer in contact with the snubbing means. Because of this clearance between the snubbing means and the aperture, the cylinder is then free to extend on the pin 4. Thus, the snubbing means can be extended from the pin when the pivot member is rotated clockwise and locked or restricted in an extended position by the counterclockwise rotation of the pivot member.

The locking action is due to the offset in centers between the snubbing means 30 and the aperture 36 in the pivotable means 22. When the member 22 is pivoted in one direction, the offset causes a tangent frictional fit. When pivoted in the other, the centers become less offset and more coincident allowing clearance between members. This action is most clearly illustrated in FIGS. 5 and 7.

Another embodiment of the vibration adjustable spacer is disclosed as element 70 in FIGS. 9, 10, 11 and 12. This spacer, which can be utilized in the same instances as that described for the first embodiment, is generally cylindrical in shape. The spacer 70 includes a cylindrical housing 72 having a central bore 74. The central bore 74 is stepped to become a smaller guide bore 76 concentric therewith. The housing 72 is further provided with a circular aperture 78 bored substantially perpendicular to the longitudinal axis of the housing.

Slidably reciprocal in the housing 72 is a piston 80. The piston 80 comprises a rounded head portion 82, a cylindrical body portion 84, and a radial collar 86. The collar 86 is guided by the inner surface of the bore 74 and the body of the piston is guided by the inner surface of the guide bore 76 during movement of the piston 80.

The spacer 70 is especially adapted to mount on a printed circuit board 94 by means of a threaded screw 96. The screw passes through a hole in the board and mates with a series of threads cut in the inner bore 74 of the housing 72. This produces an upstanding base for the reciprocal movement of the piston 80 in the direction of an energy absorbing object. The piston 80 may extend to where it touches the energy absorbing object with the rounded head 82.

The spacer 70 additionally includes a flat washer 88 generally concentrically positioned in the bore 74 as can be seen more easily in FIG. 11. The washer 88 maintains its position in the housing by means of a radially extending tang 90 which protrudes through the aperture 78. The body 84 of the piston 80 extends through a generally circular aperture 92 in the washer. The aperture 92 is centrally offset from the piston 80 to provide a different clearance depending upon its position. The washer 88 serves the same purpose of the pivotable member disclosed in the previous embodiment, i.e., forming a brake or a lock for resisting motion in one direction and freely allowing motion in the other.

Figure 9:
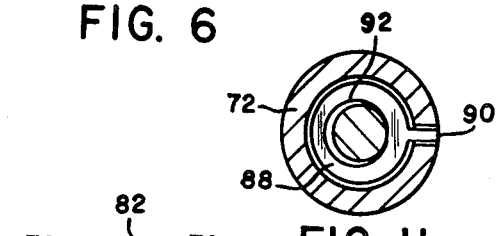
FIG. 9 is a cross-sectional side view of another embodiment of an unextended vibration adjustable spacer constructed in accordance with the teachings of the invention.
Figure 9:
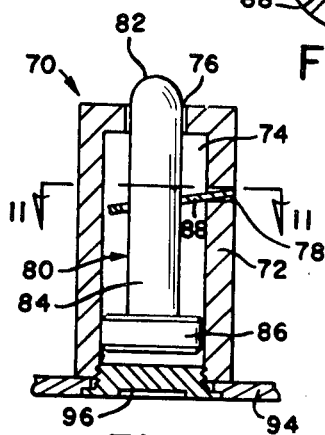
Figure 10:
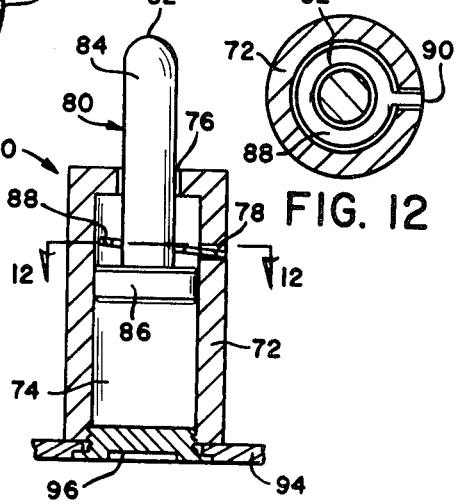
FIG. 10 is a cross-sectional side view of the vibration adjustable spacer illustrated in FIG. 9 in an extended position.

The washer pivots on the tang 90 such that, when it is in the position shown in FIGS. 9, 11, a point of tangency exists between the edge of the aperture 92 and the body 84 of the piston. This frictional contact will cause a resistance to motion in the downward direction as seen in this illustration. However, an upward thrust of the piston will cause a pivoting of the washer on the tang 90 to a position as shown in FIGS. 10 and 12. When the tang is rotated, the piston may extend freely in the upward direction as clearance is provided between the edge of aperture 92 and the body of the piston 80 as is evident in FIG. 12.

The dynamic operation of the vibration adjustable spacer depends upon the inertia of the sliding piston 80 or snubbing member 30 and the pivoting member 22 or washer 88. Accelerations in the direction toward an adjacent surface will cause movement of the assemblies together. A reversal of direction tends to cause the movable members, because of their inertia, to extend and the pivotable members to rotate to an open position. A subsequent reversal of acceleration will lock the movable members in their extended positions. This racheting effect will continue until the movable members contact an adjacent surface to which they can transfer energy.

Figure 2:
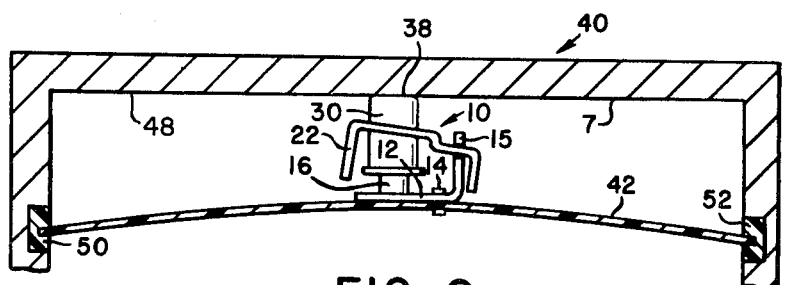
FIG. 2 is a lesser fragmentary side view of the multistack illustrated in FIG. 1 showing a printed circuit board in a vibrational mode with the snubbing means of its spacer not extended.
Figure 3:
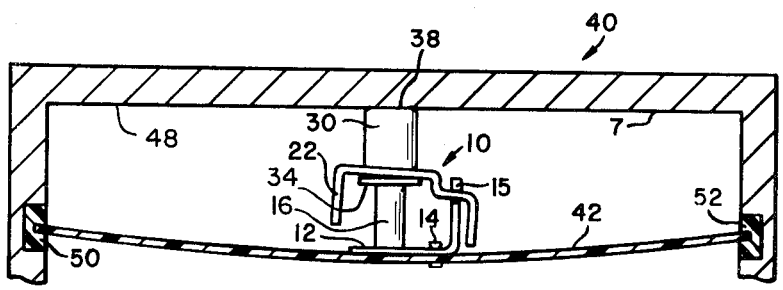
FIG. 3 is a lesser fragmentary side view of the multiboard stack illustrated in FIG. 1 showing a printed circuit board in a vibrational mode with the snubbing means of its spacer extended.
Figure 4:
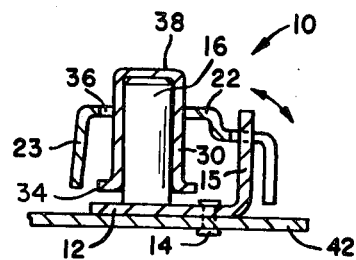
FIG. 4 is a cross-sectional side view of the unextended vibration adjustable spacer illustrated in FIG. 1.

To clarify the damping effects produced by the adjustable spacer for the printed circuit board assembly 40, reference is now given to FIGS. 1, 2, and 3. In FIG. 1 the spacer 10 is shown mounted on a typical printed circuit board 42 in the rest position. Disposed above the board well within each of the abutment surface 38 of the snubbing means 30 is a surface 7 which may be an enclosed wall of the cabinet mounting the printed circuit boards or in the case of a inner board in the stack, another printed circuit board. When vibration occurs and is transmitted through the enclosure to the multiple board stack, the boards will begin to oscillate above and below the initial rest position generally at their resonant frequency or some harmonic. This induced movement of the board will cause the snubbing means to move therewith until it contacts the relatively stationary surface 7 above. The initial contact will usually occur when the board is above its rest position, as shown in FIG. 2, at which time the board is decelerating.

Subsequently, the snubbing means 30 will rest against the relatively stationary surface 7 while the board continues its vibrational cycle toward the rest position. The board will continue downward and cross the rest position as the force on the assembly has now reversed. Note that this will generally occur below normal rest position of the board 42. Due to this reversal of acceleration force, the pivoting member 22 will travel counterclockwise to its locked or closed position as shown in FIG. 3. This position limits relative movement between the pin and the snubbing means. Thus, the snubbing means 30, because of its inertia, will remain substantially in contact with the surface 7 and damp motion of the support 16 which is attached to the board 42. The peak of the downward oscillation is reached thereafter, and the board will begin another upward cycle.

Thus, there will be an acceleration on the base member 12 in the downward direction whenever the board 42 is above the rest position. This force will cause an unlocking of the pivoting member 22 during this part of the cycle. Similarly, there will be an acceleration on the base member 12 in the upward direction whenever the board 42 is below the rest position. This force will cause a locking of the pivoting member 22 during this part of the cycle.

The frictional contacting force between the pivoting member 22 and the snubbing means 30 is approximately proportional to the decelerating force applied to the lever arm defined between the contact point and the center of pivot as well as the tangent of the angle between the sliding direction of the snubbing means and the contact-to-pivot direction of the pivoting means (the wedge angle). What is important is that this locking action occurs below the normal rest position of the board, and the acceleration force causing the locking action tends to remain in the same direction until the board again reaches the at rest position.

The board cannot, however, return easily to the rest position since the snubbing means is in contact or near contact with the stationary surface 7 before the rest position is reached. The wedging action afforded by the friction contact in the sliding direction prevents the snubbing means 30 from being moved toward the support 16 until the upward acceleration of the board has been greatly decreased. The result of this action is that a portion of the vibrational energy is transmitted to the adjacent board or wall surface, thereby reducing the resonant energy of the board. If more energy is transferred by the contact than is induced by the vibration, then the board will be damped enough to cease oscillation.

In various instances, higher modes (harmonics) of oscillation will be induced in the board where the peak of board travel will not be sufficient to cause initial contact of the snubbing means 30 with the energy absorbing surface. If, however, enough movement is produced to cause a pivoting of the pivotable member and an extension of the snubbing means, a ratcheting effect will cause the snubbing means to be extended slightly each cycle. When enough cycles have caused the extension to produce contact, the energy will be transferred and the oscillation damped out.

The operation of the spacers 10, 10', 10'' in the assembly 40 further facilitates the removal of boards 42, 44, and 46 from the guides. The assembly can be inverted and shaken to retract the spacers so as to permit free replacement.

While the preferred embodiment of the invention has been shown and described it will be obvious to those skilled in the art that various modifications and variations may be made thereto without departing from the spirit and scope of the invention as defined in the appended claims. Thus, the invention has been described in its advantageous form for the damping of resonant oscillations from a printed circuit board assembly. However, it is further obvious that the invention is useful in many other instances involving the need for a vibration adjustable spacer.

What is claimed is:
1. A vibration adjustable spacer comprising:
snubbing means for transferring vibrational energy from a first object to a second object by contact in order to damp the oscillations of the first object; said snubbing means being attached to the first object and operably extendible by the vibrations in the direction of the second object in order to contact said second object at various distances; and frictionally locking collar means for cooperating with said extendible snubbing means such that movement toward the second object by the snubbing means is unopposed and retraction of the snubbing means is impeded by frictional engagement of the collar means with said snubbing means.

2. The vibration adjustable spacer as defined in claim 1, wherein said snubbing means includes:
a supporting member attached to said first object;
a pin fixed to said supporting member and having its longitudinal axis directed toward said second object;
a sliding member having a bore, said sliding member slidably mounted on said pin by means of said bore.

3. The vibration adjustable spacer as defined in claim 2, wherein said locking collar means includes:
a plate member pivoting on said supporting member between a locking position and an open position;
and means for preventing said plate member from pivoting in excess of said open position.

4. The vibration adjustable spacer as defined in claim 3, wherein:
said plate member includes an aperture through which said sliding member extends, such that when said plate member is in an open position the sliding member is free to slide on said pin and when said plate is in a locking position the edge of the aperture is in frictional engagement with said sliding member to prevent retraction thereof from an extended position.

* * * * *